(12) United States Patent
Zhu et al.

(10) Patent No.: US 12,100,946 B2
(45) Date of Patent: Sep. 24, 2024

(54) ELECTROSTATIC PROTECTION CIRCUIT AND CHIP

(71) Applicant: CHANGXIN MEMORY TECHNOLOGIES, INC., Hefei (CN)

(72) Inventors: Ling Zhu, Hefei (CN); Kai Tian, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 175 days.

(21) Appl. No.: 17/855,845

(22) Filed: Jul. 1, 2022

(65) Prior Publication Data

US 2023/0170689 A1 Jun. 1, 2023

Related U.S. Application Data (63) Continuation of application No. PCT/CN2022/072986, filed on Jan. 20, 2022.

(30) Foreign Application Priority Data

Nov. 26, 2021 (CN) .......................... 202111419090.4

(51) Int. Cl.
*H02H 9/04* (2006.01)
*H01L 27/02* (2006.01)

(52) U.S. Cl.
CPC ......... *H02H 9/046* (2013.01); *H01L 27/0266* (2013.01); *H01L 27/0292* (2013.01)

(58) Field of Classification Search
CPC .. H02H 9/046; H01L 27/0266; H01L 27/0292
USPC .............................................. 361/56
See application file for complete search history.

(56) References Cited

U.S. PATENT DOCUMENTS

| | | | |
|---|---|---|---|
| 6,144,542 A | 11/2000 | Ker | |
| 6,459,553 B1* | 10/2002 | Drapkin | H01L 27/0266 257/355 |
| 6,522,511 B1* | 2/2003 | John | H02H 9/046 361/111 |
| 10,944,271 B1* | 3/2021 | Feng | H01R 13/6683 |
| 11,721,974 B2* | 8/2023 | Xu | H02H 9/046 361/56 |

(Continued)

FOREIGN PATENT DOCUMENTS

| | | | | |
|---|---|---|---|---|
| CN | 102341713 A | * | 2/2012 | .......... G01R 31/002 |
| CN | 110460030 B | * | 7/2022 | ............. H02H 9/025 |
| CN | 217641333 U | * | 10/2022 | .......... H02H 1/0007 |

*Primary Examiner* — Dharti H Patel
(74) *Attorney, Agent, or Firm* — Kilpatrick Townsend & Stockton LLP (57) ABSTRACT

An electrostatic protection circuit includes: a monitoring unit, a discharge unit, and a controllable voltage dividing unit, where the monitoring unit is connected to at least one probe pad, a discharge unit and a controllable voltage dividing unit, and the monitoring unit is configured to generate a first trigger signal in response to that an electrostatic pulse is present on any probe pad; the discharge unit connected between the at least one probe pad and the ground pad, and configured to form, under control of the first trigger signal, at least one path for discharging electrostatic charges to the ground pad; and the controllable voltage dividing unit is connected to the discharge unit and is configured to share a part of voltage of the first trigger signal for the discharge unit.

13 Claims, 5 Drawing Sheets

(56) References Cited

U.S. PATENT DOCUMENTS

| | | | |
|---|---|---|---|
| 2003/0076636 A1* | 4/2003 | Ker | H01L 27/0262 361/56 |
| 2003/0223166 A1* | 12/2003 | Chen | H01L 27/0266 361/56 |
| 2009/0195949 A1* | 8/2009 | Yang | H01L 27/0266 361/56 |
| 2013/0229736 A1* | 9/2013 | Van Der Borght | H02H 9/044 361/56 |
| 2014/0133055 A1* | 5/2014 | Parthasarathy | H02H 9/041 361/56 |
| 2015/0288173 A1* | 10/2015 | Chen | H01L 27/0285 361/56 |
| 2017/0085078 A1* | 3/2017 | Farbiz | H01L 27/0274 |
| 2018/0351352 A1* | 12/2018 | Chen | H01L 27/0922 |
| 2019/0341772 A1* | 11/2019 | Hsu | G01R 31/002 |
| 2021/0257353 A1* | 8/2021 | Chen | H01L 27/0266 |
| 2021/0305809 A1* | 9/2021 | Hung | H01L 27/0285 |
| 2023/0136979 A1* | 5/2023 | Zhu | H03K 17/0822 361/56 |
| 2023/0138437 A1* | 5/2023 | Wu | H02H 9/046 361/56 |
| 2023/0258698 A1* | 8/2023 | Uemura | G01R 15/06 324/679 |

\* cited by examiner

ELECTROSTATIC PROTECTION CIRCUIT AND CHIP

CROSS-REFERENCE TO RELATED APPLICATIONS

This application is a continuation of International Application No. PCT/CN2022/072986, filed on Jan. 20, 2022, which claims priority to Chinese Patent Application No. 202111419090.4, filed on Nov. 26, 2021. The disclosures of International Application No. PCT/CN2022/072986 and Chinese Patent Application No. 202111419090.4 are hereby incorporated by reference in their entireties.

BACKGROUND

In the manufacturing process of chips, an Electro-Static Discharge (ESD) phenomenon occurs, which may cause irreversible damage to the chips and reduce the yield of the chips.

In view of the ESD phenomenon, it is necessary to provide an electrostatic protection circuit for protection. However, in the related art, there is a lack of effective protection against ESD phenomena between chip probe pads.

SUMMARY

The present disclosure relates to, but is not limited to, an electrostatic protection circuit and a chip.

It is desirable to provide an electrostatic protection circuit and a chip, which can effectively protect against ESD phenomena between chip probe pads, thereby reducing the risk of chip damage and improving the yield of the chips.

The technical solution of the present disclosure is realized as follows.

Embodiments of the present disclosure provide an electrostatic protection circuit of a chip including at least one probe pad and a ground pad, the electrostatic protection circuit including a ground pad and at least one probe pad, the electrostatic protection circuit including: a monitoring unit, a discharge unit and a controllable voltage dividing unit, where the monitoring unit is respectively connected to the discharge unit, the controllable voltage dividing unit and the at least one probe pad, and the monitoring unit is configured to generate a first trigger signal in response to that an electrostatic pulse is present on any probe pad; the discharge unit is connected between the ground pad and the at least one probe pad, and configured to form, under control of the first trigger signal, at least one path for discharging electrostatic charges to the ground pad; and the controllable voltage dividing unit is connected to the discharge unit and configured to share a part of voltage of the first trigger signal for the discharge unit.

Embodiments of the present disclosure further provide a chip including a ground pad and at least one probe pad. The chip further includes an electrostatic protection circuit including: a monitoring unit, a discharge unit and a controllable voltage dividing unit. The monitoring unit is respectively connected to the discharge unit, the controllable voltage dividing unit and the at least one probe pad, and the monitoring unit is configured to generate a first trigger signal in response to that an electrostatic pulse is present on any probe pad; the discharge unit is connected between the ground pad and the at least one probe pad, and configured to form, under control of the first trigger signal, at least one path for discharging electrostatic charges to the ground pad; and the controllable voltage dividing unit is connected to the discharge unit and configured to share a part of voltage of the first trigger signal for the discharge unit.

DETAILED DESCRIPTION

In order to make the objectives, technical solutions and advantages of the present disclosure clearer, technical solutions of the embodiments of the present disclosure will be clearly and completely described below in combination with the accompanying drawings and the embodiments. The described embodiments shall not be construed as limiting the present disclosure. All other embodiments acquired by those skilled in the art without involving any inventive effort shall fall within the scope of protection of the present disclosure.

In the following description, "some embodiments" is referred to, which describe a subset of all possible embodiments, but it is understood that "some embodiments" may be the same subset or different subsets of all possible embodiments and can be combined with each other without conflict.

If a similar description of "first/second" appears in the disclosure, the following description is added. In the description, the term "first/second/third" is only used for distinguishing similar objects and does not represent a specific ranking for the objects, and it is understood that the "first/second/third" may interchange a specific order or sequence where possible to enable the embodiments of the present disclosure described herein to be implemented in an order other than that illustrated or described herein.

Unless otherwise defined, all technical and scientific terms used herein have the same meanings as generally understood by those skilled in the art belonging to the present disclosure. The terms used herein are for the purpose of describing embodiments of the present disclosure only and are not intended to limit this disclosure.

ESD refers to a phenomenon that static electricity accumulated in a human body, an apparatus or a device is turned on due to a discharge path formed by contact, and an extremely high instantaneous voltage is generated. During the testing for a unpackaged bare chip, multiple probe pads are typically introduced as test interfaces. The test machine is connected to the bare chip via probe pads and transmits test signals to the bare chip for parameter testing.

Although the probe pad is different from a bonding pad, a pin is not set for the probe pad on a packaged chip, that is to say, the probe pads of the packaged chip are not at risk of occurrence of ESD. However, since a wafer is also prone to ESD during testing, it is also necessary to add ESD protection between probe pads.

Since the instantaneous voltage generated by the ESD is high, the use of conventional power clamp circuits will cause breakdown of the gate oxide layer of the Metal-Oxide-Semiconductor (MOS) transistor, thereby causing permanent damage to the device. Therefore, a new electrostatic protection circuit needs to be designed.

Figure 1:
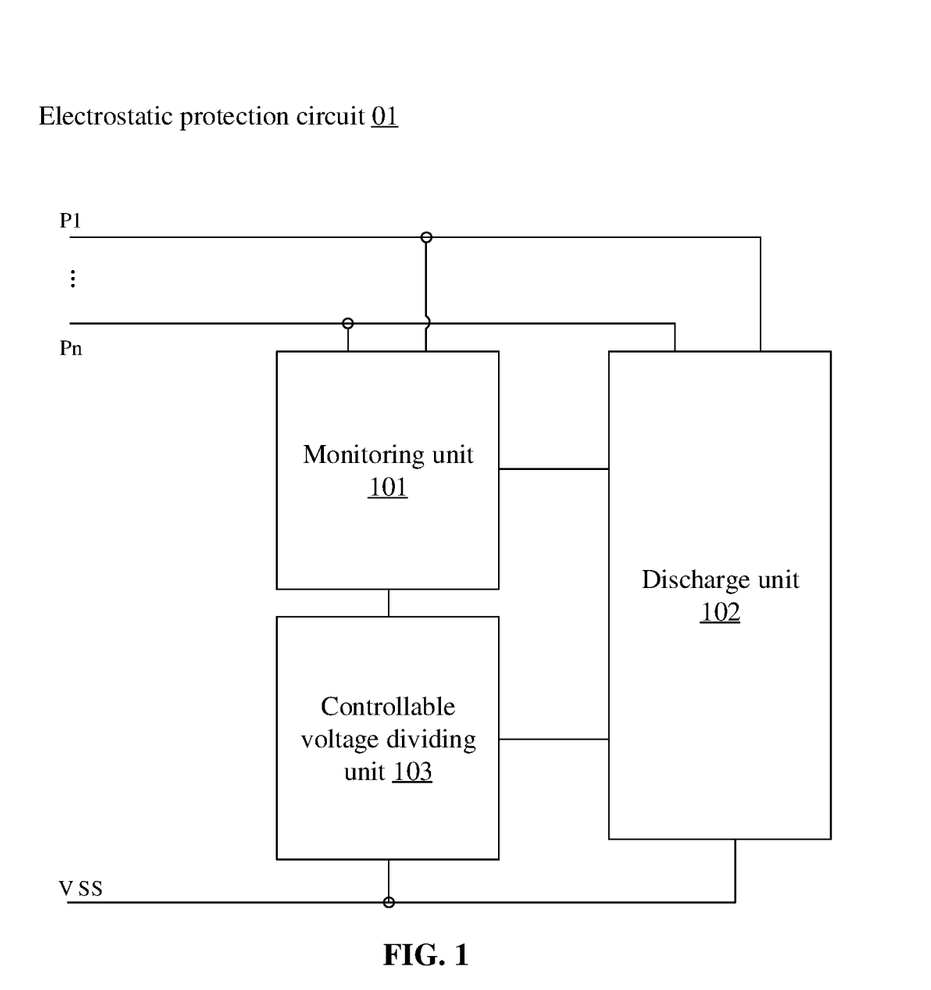
FIG. 1 is a first schematic structural diagram of an electrostatic protection circuit according to an embodiment of the present disclosure.

FIG. 1 is a schematic structural diagram of an electrostatic protection circuit of a chip according to an embodiment of the present disclosure. As shown in FIG. 1, the chip includes a ground pad VSS and at least one probe pad P1~Pn. The electrostatic protection circuit 01 includes: a monitoring unit 101, a discharge unit 102 and a controllable voltage dividing unit 103. The monitoring unit 101 is respectively connected to the discharge unit 102, the controllable voltage dividing unit 103, and the at least one probe pad P1~Pn, and configured to generate a first trigger signal in response to that an electrostatic pulse is present on any probe pad; the discharge unit 102 is connected between the ground pad VSS and the at least one probe pad, and configured to form, under control of the first trigger signal, at least one path for discharging electrostatic charges to the ground pad VSS; the controllable voltage dividing unit 103 is connected to the discharge unit and configured to share a part of voltage of the first trigger signal for the discharge unit 102.

In the embodiment of the present disclosure, the chip includes at least one probe pad P1-Pn, and during the testing of the unpackaged chip, the probe of the testing machine may be in contact with one or more of the at least one probe pad P1-Pn to transmit a test signal to the chip for parameter testing.

If ESD occurs at any of the at least one probe pad P1~Pn before the chip is packaged, an electrostatic pulse is generated at the probe pad, i.e., a transient fluctuating voltage is generated at the probe pad. The peak value of the voltage is determined by the amount of electrostatic charges that generates ESD, which can be much greater than the breakdown voltage of the device in the chip, and thus may cause permanent damage of the device.

In the embodiment of the present disclosure, the monitoring unit 101 may generate the first trigger signal under the action of the electrostatic pulse. When the voltage peak of the electrostatic pulse is large, the first trigger signal also has a large voltage peak. Therefore, the controllable voltage dividing unit 103 is required to share a part of the voltage of the first trigger signal for the discharge unit 102 to avoid damaging the discharge unit 102 by the first trigger signal.

It can be understood that the monitoring unit 101 generates a first trigger signal under the trigger of the electrostatic pulse, and a path is formed in the discharge unit 102 to discharge the electrostatic charges of the probe pads, so that effective protection can be provided against the ESD phenomenon between the chip probe pads.

Furthermore, since the first trigger signal may have a large voltage peak, the controllable voltage dividing unit 103 shares a part of the voltage of the first trigger signal for the discharge unit 102, so that the first trigger signal can be prevented from damaging the discharge unit 102, thereby reducing the risk of chip damage and improving the yield of chips.

In some embodiments of the present disclosure, the discharge unit 102 includes at least one transistor. The controllable voltage dividing unit 103 includes a first voltage dividing element having a first end and a second end and a second voltage dividing element having a first end and a second end, the first voltage dividing element and the second voltage dividing element being configured to share the part of voltage of the first trigger signal for the at least one transistor. The first ends of the first voltage dividing element and the second voltage dividing element are correspondingly connected to a gate of the at least one transistor, the second end of the first voltage dividing element is connected to the monitoring unit 101, and the second end of the second voltage dividing element is connected to a ground terminal VSS.

Figure 2:
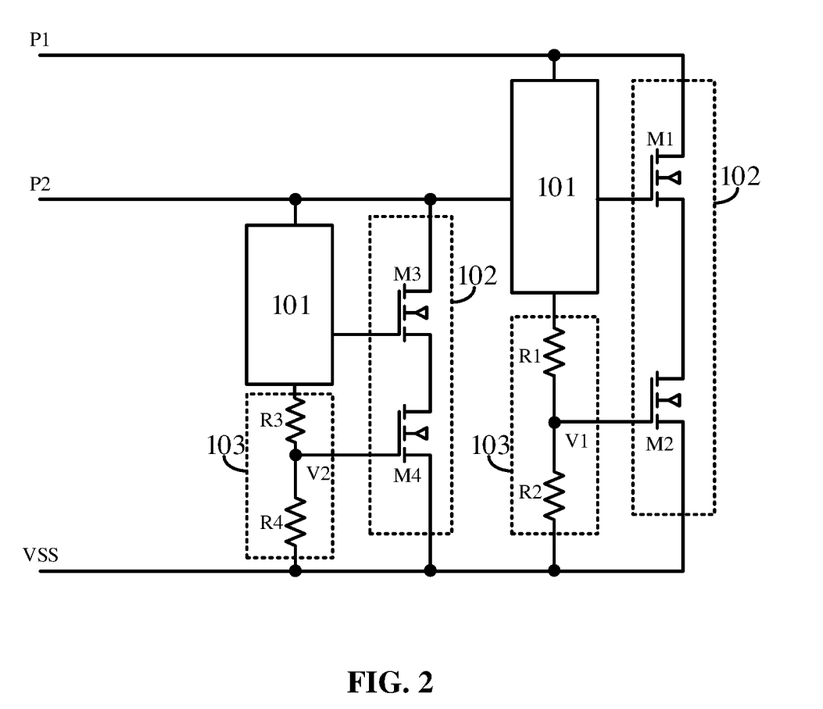
FIG. 2 is a second schematic structural diagram of an electrostatic protection circuit according to an embodiment of the present disclosure.

In some embodiments of the present disclosure, as shown in FIG. 2, the at least one transistor includes a second transistor M2 and a fourth transistor M4; the first voltage dividing element includes a first resistor R1 and a third resistor R3; and the second voltage dividing element includes a second resistor R2 and a fourth resistor R4. A first end of the first resistor R1 and a first end of the second resistor R2 are both connected to a gate of the second transistor, and a first end of the third resistor R3 and a first end of the fourth resistor R4 are both connected to a gate of the fourth transistor M4; and a second end of the first resistor R1 and a second end of the third resistor R3 are respectively connected to the monitoring unit 101, and a second end of the second resistor R2 and a second end of the fourth resistor R4 are both connected to the ground terminal VSS.

As shown in FIG. 2, the discharge unit 102 further includes a first transistor M1 and a third transistor M3. A drain of the first transistor M1 and a drain of the third transistor M3 are respectively connected to a respective one of the at least one probe pad; a gate of the first transistor M1 and a gate of the third transistor M3 are respectively connected to the monitoring unit 101; and a source of the first transistor M1 are connected to a drain of the second transistor M2, and a source of the third transistor M3 being connected to a drain of the fourth transistor M4.

In the embodiment of the present disclosure, the gate of the second transistor M2 is connected to the connection point of the first resistor R1 and the second resistor R2. Therefore, the gate voltage V1 of the second transistor M2 is affected by the resistance values of the first resistor R1 and the second resistor R2, that is to say, the ratio of the resistance value of the first resistor R1 to the resistance value of the second resistor R2 determines the voltage division ratio of the gate voltage V1; similarly, the gate of the fourth transistor M4 is connected between the third resistor R3 and the fourth resistor R4. Therefore, the ratio of the resistance value of the third resistor R3 to the resistance value of the fourth resistor R4 determines the voltage division ratio of the gate voltage V2.

The monitoring unit 101 transmits the first trigger signal to the controllable voltage dividing unit 103 to trigger the gate voltage V1 and the gate voltage V2 to rise. By adjusting the resistance values of the first resistor R1 and the second resistor R2 to an appropriate range, the raised gate voltage V1 can be greater than the turn-on voltage of the second transistor M2 and smaller than the breakdown voltage of the second transistor M2. As such, not only the source and the drain of the second transistor M2 become conductive to discharge the electrostatic charges to the ground pad VSS, but also the breakdown of the gate oxide layer of the second transistor M2 is avoided.

Similarly, by adjusting the resistance values of the third resistor R3 and the fourth resistor R4 to an appropriate range, the raised gate voltage V2 can be made to reach the turn-on voltage of the fourth transistor M4 and smaller than the breakdown voltage of the fourth transistor M4. As such, not only the source and the drain of the fourth transistor M4 become conductive to discharge the electrostatic charges to the ground pad VSS, but also the breakdown of the gate oxide layer of the fourth transistor M4 is avoided.

It is to be noted that the first voltage dividing element and the second voltage dividing element may include other implementations. For example, the first voltage dividing element and the second voltage dividing element may be composed of multiple sub-resistors connected in series or in parallel, and the equivalent resistance value may be adjusted by changing the number of resistors connected in series or in parallel. For another example, the first voltage dividing element and the second voltage dividing element are adjustable resistors, and adjustment of the resistance is achieved by sliding the pointer. The above-described implementations, as well as other simple variations or substitutions made on the basis of embodiments of the present disclosure, should be considered as falling within the scope of the present disclosure.

It will be appreciated that the voltage dividing ratio of the gate voltage of the transistor in the discharge unit 102 can be controlled by adjusting the parameters of the voltage dividing elements in the controllable voltage dividing unit 103, so that the gate voltage of the transistor can be controlled to an appropriate range. Thus, it is ensured that the transistor in the discharge unit 102 can be turned on to form the path when the ESD occurs; furthermore, the breakdown of the gate oxide layer of the transistor in the discharge unit 102 is avoided, and the risk of chip damage is reduced.

In some embodiments of the present disclosure, the monitoring unit 101 includes a capacitor module configured to generate the first trigger signal by resistance-capacitance coupling, in response to that the electrostatic pulse is present on any probe pad. A first end of the capacitor module is connected to the at least one probe pad, a second end of the capacitor module is connected to the discharge unit 102, and a third end of the capacitor module is connected to the controllable voltage dividing unit 103.

Figure 3:
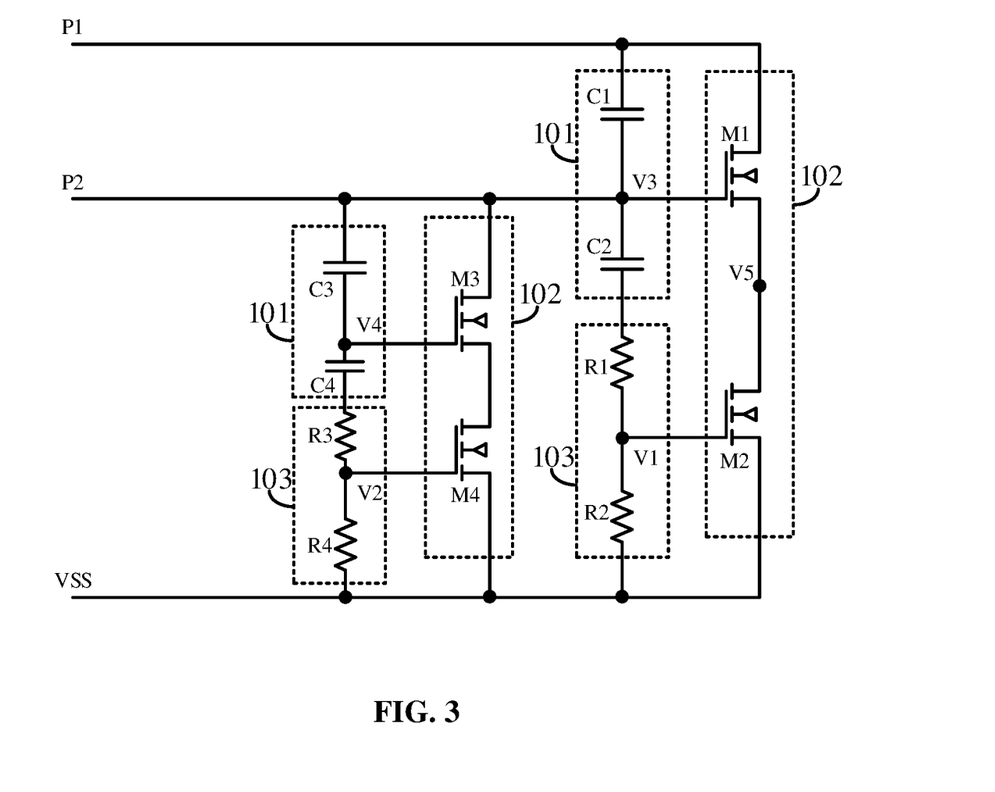
FIG. 3 is a third schematic structural diagram of an electrostatic protection circuit according to an embodiment of the present disclosure.

In some embodiments of the present disclosure, as shown in FIG. 3, the capacitor module includes a first capacitor C1, a second capacitor C2, a third capacitor C3, and a fourth capacitor C4. The at least one probe pad includes a first probe pad P1 and a second probe pad P2. The second end of the first capacitor C1 and the second end of the second capacitor C2 are connected to the gate of the first transistor M1, the second end of the third capacitor C3 and the second end of the fourth capacitor C4 are connected to the gate of the third transistor M3, and the connection terminal of the first capacitor C1 and the second capacitor C2 and the connection terminal of the third capacitor C3 and the fourth capacitor C4 serve as the second end of the capacitor module.

The first end of the first capacitor C1 and the first end of the third capacitor C3 are connected to at least one probe pad, respectively. Specifically, both the drain of the first transistor M1 and the first end of the first capacitor C1 are connected to the first probe pad P1, and both the drain of the third transistor M3 and the first end of the third capacitor C3 are connected to the second probe pad P2. The first end of the first capacitor C1 and the first end of the third capacitor C3 serve as the first end of the capacitor module.

The first end of the second capacitor C2 and the first end of the fourth capacitor C4 are respectively connected to the controllable voltage dividing unit 103. Specifically, the first end of the second capacitor C2 is connected to the second end of the first resistor R1, and the first end of the fourth capacitor C4 is connected to the second end of the third resistor R3. The first end of the second capacitor C2 and the first end of the fourth capacitor C4 serve as the third end of the capacitor module.

In the embodiment of the present disclosure, the first probe pad P1 and the second probe pad P2 may maintain a fixed voltage during the testing of the unpackaged chip. For example, the voltage of the first probe pad P1 is maintained at 6 V, and the voltage of the second probe pad P2 is maintained at 3 V. In this case, the first capacitor C1, the second capacitor C2 and the third capacitor C3 become non-conductive, so that the second transistor M2, the third transistor M3 and the fourth transistor M4 are in the off state; and the gate voltage V3 of the first transistor M1 is 3 V, the source voltage V5 of the first transistor M1 is clamped to (3V−Vth). Thus, the electrostatic protection circuit does not form a path, and thus does not function.

In the embodiment of the present disclosure, when the first probe pad P1 contacts with the electrostatic charges to generate the electrostatic pulse, since the electrostatic pulse is a transient fluctuating voltage, which is equivalent to an alternating current (AC) voltage, the first capacitor C1 may become conductive to increase the gate voltage V3 of the first transistor M1. When the gate voltage V3 is raised to the turn-on voltage of the first transistor M1, the source and drain of the first transistor M1 become conductive. Furthermore, the gate voltage V3 is raised within a short time, which is also equivalent to the AC voltage. Therefore, the second capacitor C2 can become conductive to raise the gate voltage V1 of the second transistor M2. When the gate voltage V1 is raised to the turn-on voltage of the second transistor M2, the source and drain of the second transistor M2 become conductive. Thus, the first transistor M1 and the second transistor M2 form a path for discharging the electrostatic charges from the first probe pad P1 to the ground pad VSS.

On the other hand, when the gate voltage V3 is raised within a short time, the third capacitor C3 can become conductive to raise the gate voltage V4 of the third transistor M3. When the gate voltage V4 is raised to the turn-on voltage of the third transistor M3, the source and drain of the third transistor M3 become conductive. Furthermore, the gate voltage V4 is raised within a short time and the fourth capacitor C4 can become conductive to raise the gate voltage V2 of the fourth transistor M4. When the gate voltage V2 is raised to the turn-on voltage of the fourth transistor M4, the source and drain of the fourth transistor M4 become conductive. Thus, the first capacitor C1, the third transistor M3 and the fourth transistor M4 form another path for discharging the electrostatic charges from the first probe pad P1 to the ground pad VSS.

In the embodiment of the present disclosure, when the second probe pad P2 contacts with the electrostatic charges to generate the electrostatic pulse, since the electrostatic pulse is a transient fluctuating voltage which is equivalent to the AC voltage, the third capacitor C3 may become conductive to increase the gate voltage V4 of the third transistor M3. When the gate voltage V4 is raised to the turn-on voltage of the third transistor M3, the source and drain of the third transistor M3 become conductive. Furthermore, the gate voltage V4 is raised within a short time, which is also equivalent to the AC voltage, so that the fourth capacitor C4 can become conductive to raise the gate voltage V2 of the fourth transistor M4. When the gate voltage V2 is raised to the turn-on voltage of the fourth transistor M4, the source and drain of the fourth transistor M4 become conductive. Thus, the third transistor M3 and the fourth transistor M4 form a path for discharging electrostatic charges from the second probe pad P2 to the ground pad VSS.

In the embodiment of the present disclosure, the first transistor M1, the second transistor M2, the third transistor M3 and the fourth transistor M4 may all be Negative-channel Metal-Oxide-Semiconductor (NMOS) transistors to discharge positive electrostatic charges for the first probe pad P1 and the second probe pad P2. The first transistor M1, the second transistor M2, the third transistor M3 and the fourth transistor M4 may all be Positive-channel Metal-Oxide-Semiconductor (PMOS) transistors to discharge negative electrostatic charges for the first probe pad P1 and the second probe pad P2.

In the embodiment of the present disclosure, since the electrostatic pulse is a transient fluctuating voltage, the frequency of its equivalent AC voltage is high, and the capacitive impedance of the capacitor when the capacitor becomes conductive is inversely proportional to the frequency of the electrical signal. Therefore, when the first capacitor C1 and the third capacitor C3 become conductive, the capacitive impedance thereof is small, so that the division voltage across each of the first capacitor C1 and the third capacitor C3 is small, and the gate voltages V3 and V4 are large division voltages, which makes it easier to reach the turn-on voltage of the first transistor M1 and the third transistor M3.

It can be understood that, by using the electrical characteristics of the capacitor device, the monitoring unit 101 can maintain an off state when a constant detection voltage is applied to the probe pad, so as to avoid an influence of the electrostatic protection circuit on the chip test process. When an ESD occurs at the probe pad, the monitoring unit 101 can be turned on to discharge the electrostatic charges and protect the chip from being damaged.

Furthermore, when ESD occurs, the capacitive impedance of the capacitor device is small, so that the voltage division ratio of the gate voltage of the transistor is high, it is easier to reach the turn-on voltage to form the discharge path, and it is advantageous to avoid a large voltage difference between the gate and the drain of the transistor, thereby preventing the transistor from being reversed breakdown.

In some embodiments of the present disclosure, the chip further includes a power supply pad. The monitoring unit 101 is further connected to the power supply pad, and further configured to generate a second trigger signal in response to that the electrostatic pulse is present on the power supply pad; and the discharge unit 102 is further connected between the power supply pad and the ground pad, and further configured to be turned on under control of the second trigger signal, so as to discharge the electrostatic charges to the ground pad.

Figure 4:
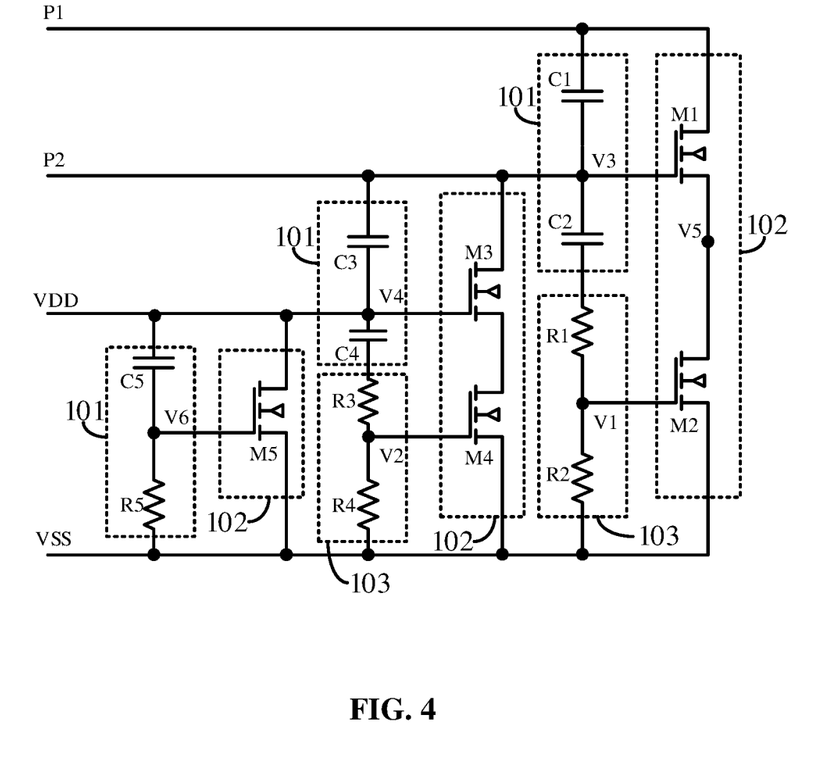
FIG. 4 is a fourth schematic structural diagram of an electrostatic protection circuit according to an embodiment of the present disclosure.

In some embodiments of the present disclosure, the monitoring unit 101 further includes a fifth capacitor C5 and a fifth resistor R5. The discharge unit 102 further includes a fifth transistor M5.

A first end of the fifth capacitor C5 is connected to the power supply pad VDD, a second end of the fifth capacitor C5 is connected to a first end of the fifth resistor R5, and a second end of the fifth resistor R5 is connected to the ground pad VSS. The fifth capacitor C5 is configured to generate the second trigger signal by the resistance-capacitance coupling, in response to that the electrostatic pulse is present on the power supply pad VDD.

a drain of the fifth transistor M5 being connected to the power supply pad VDD, a source of the fifth transistor M5 being connected to the ground pad VSS, and a second end of the fifth capacitor C5 and the first end of the fifth resistor R5 being also both connected to a gate of the fifth transistor M5. The fifth transistor M5 is configured to be turned on under control of the second trigger signal, so as to discharge the electrostatic charges to the ground pad.

In the embodiment of the present disclosure, when the power supply pad VDD contacts with the electrostatic charges to generate the electrostatic pulse, since the electrostatic pulse is a transient fluctuating voltage, which is equivalent to an AC voltage, the fifth capacitor C5 may become conductive to increase the gate voltage V6 of the fifth transistor M5. When the gate voltage V6 is raised to the turn-on voltage of the fifth transistor M5, the source and drain of the fifth transistor M5 become conductive to form a path for discharging the electrostatic charges from the power supply pad VDD to the ground pad VSS.

In the embodiments of the present disclosure, when the first probe pad P1 contacts the electrostatic charges to generate the electrostatic pulse, the first capacitor C1 and the third capacitor C3 become conductive, and the gate voltage V4 is raised briefly. In this way, the fifth capacitor C5 can become conductive to raise the gate voltage V6 of the fifth transistor M5. When the gate voltage V6 is raised to the turn-on voltage of the fifth transistor M5, the source and drain of the fifth transistor M5 become conductive. Thus, the first capacitor C1, the third capacitor C3, and the fifth transistor M5 also form a path for discharging the electrostatic charges from the first probe pad P1 to the ground pad VSS.

Similarly, when the second probe pad P2 contacts the electrostatic charges to generate the electrostatic pulse, the third capacitor C3 become conductive and the gate voltage V4 is raised shortly. In this way, the fifth capacitor C5 can become conductive to raise the gate voltage V6 of the fifth transistor M5. When the gate voltage V6 is raised to the turn-on voltage of the fifth transistor M5, the source and drain of the fifth transistor M5 become conductive. Thus, the third capacitor C3 and the fifth transistor M5 also form a path for discharging the electrostatic charges from the second probe pad P2 to the ground pad VSS.

In the embodiment of the present disclosure, the first transistor M1, the second transistor M2, the third transistor M3, the fourth transistor M4, and the fifth transistor M5 may all be NMOS to discharge positive electrostatic charges for the first probe pad P1, the second probe pad P2 and the power supply pad VDD.

It is understood that, when ESD occurs at the power supply pad VDD, the fifth capacitor C5 and the fifth resistor R5 generate a second trigger signal to trigger the fifth transistor M5 to turn on to form a path for discharging the electrostatic charges on the power supply pad VDD.

Furthermore, when ESD occurs at the probe pad, the fifth transistor M5 may also be triggered to be turned on to provide an additional path, thereby improving the discharge efficiency of the electrostatic charges.

Figure 5:
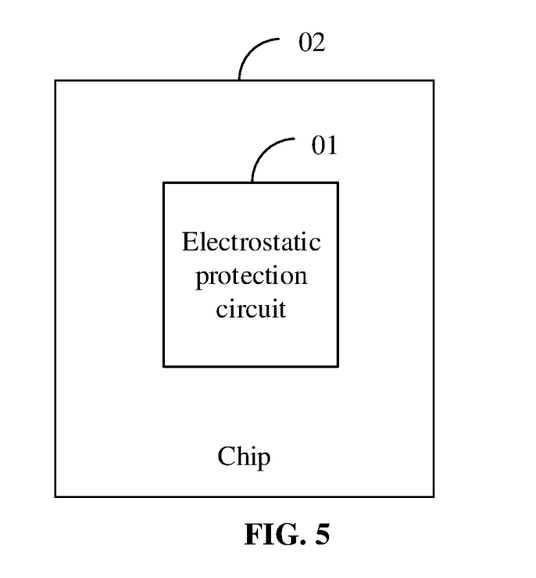
FIG. 5 is a schematic structural diagram of a chip according to an embodiment of the present disclosure.

An embodiment of the present disclosure further provides a chip 02 including an electrostatic protection circuit 01 as shown in FIG. 5.

In some embodiments of the present disclosure, the chip 02 includes at least a semiconductor memory.

In some embodiments of the present disclosure, the semiconductor memory includes at least a dynamic random access memory (DRAM).

It is to be noted that, in this disclosure, the terms "includes", "including" or any other variation thereof, are intended to cover a non-exclusive inclusion, such that a process, method, article, or device that includes a list of elements includes not only those elements but also other elements not expressly listed, or also includes elements inherent to such process, method, article, or device. Without more limitations, an element is defined by the statement "including a . . . " that does not rule out there are additional identical elements in a process, method, article, or apparatus that includes the element.

The above-described embodiments of the present disclosure are for the purpose of description only and do not represent the advantages or disadvantages of the embodiments. The methods disclosed in the method embodiments provided in this disclosure can be arbitrarily combined without conflict to obtain new method embodiments. The features disclosed in the product embodiments provided in this disclosure can be arbitrarily combined without conflict to obtain new product embodiments. The features disclosed in the method or apparatus embodiments provided in this disclosure can be arbitrarily combined without conflict to obtain new method embodiments or apparatus embodiments.

The above is only the specific embodiments of the disclosure, but the scope of protection of the disclosure is not limited to this. Any person skilled in the technical field who can easily think of change or replacement within the technical scope of the disclosure shall be covered in the scope of protection of the disclosure. Therefore, the protection scope of the disclosure shall be subject to the protection scope of the claims.

INDUSTRIAL PRACTICABILITY

Embodiments of the present disclosure provide an electrostatic protection circuit and a chip. The electrostatic protection circuit includes a monitoring unit, a discharge unit and a controllable voltage dividing unit. The monitoring unit is respectively connected to at least one probe pad, and a discharge unit and a controllable voltage dividing unit, and the monitoring unit is configured to generate a first trigger signal in response to that an electrostatic pulse is present on any probe pad. The discharge unit is connected between the at least one probe pad and the ground pad, and configured to form, under control of the first trigger signal, at least one path for discharging electrostatic charges to the ground pad. The controllable voltage dividing unit is connected to the discharge unit and configured to share a part of voltage of the first trigger signal for the discharge unit. The monitoring unit generates the first trigger signal under the trigger of electrostatic pulse, so that a path is formed in the discharge unit to discharge the electrostatic charges on the probe pad. In this way, the ESD phenomenon between the chip probe pads can be effectively protected. Furthermore, since the first trigger signal may have a large voltage peak, the controllable voltage dividing unit can share a part of the voltage of the first trigger signal for the discharge unit, so that the first trigger signal can be prevented from damaging the discharge unit, thereby reducing the risk of chip damage and improving the yield of chips.

The invention claimed is:

1. An electrostatic protection circuit for a chip comprising a ground pad and at least one probe pad, the electrostatic protection circuit comprising: a monitoring unit, a discharge unit and a controllable voltage dividing unit,
wherein the monitoring unit is connected to the discharge unit, the controllable voltage dividing unit and the at least one probe pad, and the monitoring unit is configured to generate a first trigger signal in response to that an electrostatic pulse is present on any probe pad;
the discharge unit is connected between the ground pad and the at least one probe pad, and configured to form, under control of the first trigger signal, at least one path for discharging electrostatic charges to the ground pad; and
the controllable voltage dividing unit is connected to the discharge unit and configured to share a part of voltage of the first trigger signal for the discharge unit; and,
wherein the discharge unit comprises at least one transistor; the controllable voltage dividing unit comprises: a first voltage dividing element having a first end and a second end, and a second voltage dividing element having a first end and a second end, the first voltage dividing element and the second voltage dividing element being configured to share the part of voltage of the first trigger signal for the at least one transistor,
wherein the first ends of the first voltage dividing element and the second voltage dividing element are correspondingly connected to a gate of a respective one of the at least one transistor, the second end of the first voltage dividing element is connected to the monitoring unit, and the second end of the second voltage dividing element is connected to a ground terminal,
wherein the at least one transistor comprises a second transistor and a fourth transistor; the first voltage dividing element comprises a first resistor and a third resistor; and the second voltage dividing element comprises a second resistor and a fourth resistor,
wherein a first end of the first resistor and a first end of the second resistor are both connected to a gate of the second transistor, and a first end of the third resistor and a first end of the fourth resistor are both connected to a gate of the fourth transistor; and
a second end of the first resistor and a second end of the third resistor are respectively connected to the monitoring unit, and a second end of the second resistor and a second end of the fourth resistor are both connected to the ground terminal.

2. The circuit of claim 1, wherein the discharge unit further comprises a first transistor and a third transistor,
a drain of the first transistor and a drain of the third transistor being respectively connected to a respective one of the at least one probe pad;
a gate of the first transistor and a gate of the third transistor being respectively connected to the monitoring unit; and
a source of the first transistor being connected to a drain of the second transistor, and a source of the third transistor being connected to a drain of the fourth transistor.

3. The circuit of claim 2, wherein the at least one probe pad comprises a first probe pad and a second probe pad,
both the drain of the first transistor and the first end of the first capacitor are connected to the first probe pad; and
both the drain of the third transistor and the first end of the third capacitor are connected to the second probe pad.

4. The circuit of claim 2, wherein the first end of the second capacitor is connected to the second end of the first resistor; and the first end of the fourth capacitor is connected to the second end of the third resistor.

5. The circuit of claim 2, wherein the first transistor, the second transistor, the third transistor, the fourth transistor and the fifth transistor are all Negative-channel Metal-Oxide-Semiconductor (NMOS) transistors.

6. The circuit of claim 1, wherein the monitoring unit comprises: a capacitor module configured to generate the first trigger signal by resistance-capacitance coupling, in response to that the electrostatic pulse is present on any probe pad, wherein a first end of the capacitor module is connected to the at least one probe pad, a second end of the capacitor module is connected to the discharge unit, and a third end of the capacitor module is connected to the controllable voltage dividing unit.

7. The circuit of claim 6, wherein the capacitor module comprises: a first capacitor, a second capacitor, a third capacitor and a fourth capacitor, wherein a first end of the first capacitor and a first end of the third capacitor are respectively connected to a respective one of the at least one probe pad, the first end of the first capacitor and the first end of the third capacitor serving as a first end of the capacitor module;

a second end of the first capacitor and a second end of the second capacitor are both connected to the gate of the first transistor, a second end of the third capacitor and a second end of the fourth capacitor are both connected to the gate of the third transistor, wherein a connection terminal connecting the first capacitor and the second capacitor and a connection terminal connecting the third capacitor and the fourth capacitor serve as the second end of the capacitor module; and a first end of the second capacitor and a first end of the fourth capacitor are respectively connected to the controllable voltage dividing unit, wherein the first end of the second capacitor and the first end of the fourth capacitor serves as the third end of the capacitor module.

8. The circuit of claim 1, wherein the chip further comprises a power supply pad, the monitoring unit is further connected to the power supply pad, and further configured to generate a second trigger signal in response to that an electrostatic pulse is present on the power supply pad; and the discharge unit is further connected between the power supply pad and the ground pad, and further configured to be turned on under control of the second trigger signal, so as to discharge the electrostatic charges to the ground pad.

9. The circuit of claim 8, wherein the monitoring unit further comprises a fifth capacitor and a fifth resistor, wherein a first end of the fifth capacitor is connected to the power supply pad, a second end of the fifth capacitor is connected to a first end of the fifth resistor, and a second end of the fifth resistor is connected to the ground pad, wherein the fifth capacitor is configured to generate the second trigger signal by the resistance-capacitance coupling, in response to that the electrostatic pulse is present on the power supply pad.

10. The circuit of claim 9, wherein the discharge unit further comprises a fifth transistor, a drain of the fifth transistor being connected to the power supply pad, a source of the fifth transistor being connected to the ground pad, and the second end of the fifth capacitor and the first end of the fifth resistor being also both connected to a gate of the fifth transistor, wherein the fifth transistor is configured to be turned on under control of the second trigger signal, so as to discharge the electrostatic charges to the ground pad.

11. A chip comprising a ground pad and at least one probe pad, wherein the chip further comprises an electrostatic protection circuit comprising: a monitoring unit, a discharge unit and a controllable voltage dividing unit, wherein the monitoring unit is connected to the discharge unit, the controllable voltage dividing unit and the at least one probe pad, and the monitoring unit is configured to generate a first trigger signal in response to that an electrostatic pulse is present on any probe pad;

the discharge unit is connected between the ground pad and the at least one probe pad, and configured to form, under control of the first trigger signal, at least one path for discharging electrostatic charges to the ground pad; and the controllable voltage dividing unit is connected to the discharge unit and configured to share a part of voltage of the first trigger signal for the discharge unit; and, wherein the discharge unit comprises at least one transistor; the controllable voltage dividing unit comprises: a first voltage dividing element having a first end and a second end, and a second voltage dividing element having a first end and a second end, the first voltage dividing element and the second voltage dividing element being configured to share the part of voltage of the first trigger signal for the at least one transistor, wherein the first ends of the first voltage dividing element and the second voltage dividing element are correspondingly connected to a gate of a respective one of the at least one transistor, the second end of the first voltage dividing element is connected to the monitoring unit, and the second end of the second voltage dividing element is connected to a ground terminal, wherein the at least one transistor comprises a second transistor and a fourth transistor; the first voltage dividing element comprises a first resistor and a third resistor; and the second voltage dividing element comprises a second resistor and a fourth resistor, wherein a first end of the first resistor and a first end of the second resistor are both connected to a gate of the second transistor, and a first end of the third resistor and a first end of the fourth resistor are both connected to a gate of the fourth transistor; and a second end of the first resistor and a second end of the third resistor are respectively connected to the monitoring unit, and a second end of the second resistor and a second end of the fourth resistor are both connected to the ground terminal.

12. The chip of claim 11, wherein the chip comprises at least a semiconductor memory.

13. The chip of claim 12, wherein the semiconductor memory comprises at least a Dynamic Random Access Memory (DRAM).

* * * * *